United States Patent [19]

Pollmeier

[11] 4,123,670
[45] Oct. 31, 1978

[54] TRANSISTOR SWITCHING CIRCUIT

[75] Inventor: Werner Pollmeier, Verl, Fed. Rep. of Germany

[73] Assignee: Nixdorf Computer AG, Paderborn, Fed. Rep. of Germany

[21] Appl. No.: 747,983

[22] Filed: Dec. 6, 1978

[30] Foreign Application Priority Data

Dec. 8, 1975 [DE] Fed. Rep. of Germany ....... 2255168

[51] Int. Cl.² .......................................... H03K 17/00
[52] U.S. Cl. .................................... 307/254; 307/253; 307/300; 307/270
[58] Field of Search ................. 307/300, 254, 35, 270; 330/15; 321/8

[56] References Cited

U.S. PATENT DOCUMENTS

| | | | |
|---|---|---|---|
| 2,933,642 | 4/1960 | Marley | 307/300 |
| 3,040,269 | 6/1962 | Hemphell et al. | 330/15 |
| 3,569,742 | 3/1971 | Schroeder | 307/300 |
| 3,805,094 | 4/1974 | Orlando | 307/300 |
| 3,983,418 | 9/1976 | Wallace | 307/300 |

FOREIGN PATENT DOCUMENTS 692,368  8/1964  Canada .................................... 307/300

*Primary Examiner*—Stanley D. Miller, Jr.
*Assistant Examiner*—B. P. Davis
*Attorney, Agent, or Firm*—Gifford, Chandler, VanOphem, Sheridan & Sprinkle

[57] ABSTRACT

A transistor switching circuit arrangement for switching at least one switching transistor on and off wherein, in order to achieve low power dissipation by delaying the change which occurs in base current to the cut-off value on conversion into the blocked state and by a subsequent brief disruptive operation of the base emitter section and in order to achieve fast switching on, there is provided a choke coil through part of which the base-emitter current of said switching transistor is fed and through part of which the current being switched is passed in positive feedback mode.

12 Claims, 11 Drawing Figures

TRANSISTOR SWITCHING CIRCUIT

BACKGROUND OF THE INVENTION

I. Field of the Invention

This invention relates to transistor switching circuit arrangements and is most advantageously applicable to the switching on and off of switching transistors of high cut-off voltage.

II. Description of the Prior Art

The object of the invention is to provide improved transistor switching circuits which, while retaining the advantages of simple and inexpensive circuitry nevertheless achieve the desirable results of low power dissipation and fast switching. As will be later described, the invention provides improved, simple and inexpensive switching circuits in which low power dissipation is achieved by delaying the base current change to cut-off value which occurs on conversion into the blocked state and, by a subsequent brief disruptive operating of the base-emitter of the switching transistor section, and fast switching is achieved by increasing the base current which occurs at the time of switching on.

On regulating a switching transistor having a relatively high cut-off voltage, for example a triple-diffused transistor, to change it into the blocked state from the conducting state, with strong base current values in the blocked direction, charge carriers present are withdrawn from the area of the base-emitter. If such a clearing operation of the charge carriers is performed rapidly by using a strong base current, then, because of the asymmetry of a switching transistor, the collector-base section continues to conduct for a brief time after this clearing of the base-emitter section. The reason for this is that the accelerated clearing of the base-emitter section produces a delay in the discharge of charge carriers.

Such slowed clearing of the collector-base section, however, involves an increase in the time taken to switch off the collector current, and this, in turn, produces an increase in the switching-off power dissipation of the transistor. It is possible to reduce this switching-off power dissipation by speeding up clearing of the collector-base section by delaying the change in base current to the cut-off current value at the time of cut-off. If, beyond this, the base-emitter section, after reaching the cut-off current value, is operated disruptively for a certain period of time subsequently, the clearing time of the collector base section can be further reduced. This is because any residual charges still present are discharged via the conducting base-emitter section. By resorting to both these expedients a considerable reduction of the switching-off power dissipation of the transistor is possible.

On the other hand, however, it is also desirable to have a fast switch on of the transistor, more especially if there is any substantial amount of inductance present in the regulating current circuit. In order to increase the speed of switch on of the transistor, the base current may be enhanced at the instant of switching on, thus reducing the delay in the increase of base current.

Known circuit arrangements capable of satisfying the foregoing requirements are very expensive and complicated. The reason for this is that they work on the principle of regulating the base by more than one control voltage, the control voltages used being without a common reference potential. In order to ensure the obtaining of correct values for these control voltages it is necessary to provide correspondingly potential-free monitoring circuits, more especially in cases in which current is being supplied to data processing apparatus. Such monitoring circuits are expensive and complex.

SUMMARY OF THE PRESENT INVENTION

The present invention seeks to avoid these previously known defects and disadvantages and to provide simple and inexpensive transistor switching circuit arrangements which result in low power dissipation by a switching transistor and in fast switching on (without need to provide special circuits for potential-free actuation) and thus providing transistor switching circuits of high efficiency.

The invention achieves its objects of fast switch on and low switching-on power dissipation by providing only a single additional switching circuit element, namely a choke coil which is operated in positive feedback connection mode. This choke coil, which is operated in positive feedback connection mode in the base-emitter current circuit of a transistor connects the base of said transistor with a source of reference potential. The emitter of the transistor is connected to a tap on this choke coil. Accordingly, emitter current can flow through part of the choke coil when the transistor is switched on, so that the increase in emitter current is transferred to the base current circuit via the choke by virtue of the positive feedback effect, and there increases the rate of increase in base current that may be retarded by inductive effects. At the same time, however, the choke is magnetized by the emitter current flowing through it, so that the increase in the rate of increase in base current effected by the choke ceases when the final value of magnetizing current or, i.e., the point of magnetic saturation is reached, only the base current due to actuation of the transistor thereafter continuing to flow. Upon switching off, the base of the switching transistor is supplied with a cut-off voltage which causes the base current to fall to the cut-off current value. This fall of base current voltage is delayed by the inductance of the part of the choke coil in the base emitter current circuit. If, subsequently, the terminal value of the cut-off current is reached and, consequently, a change in the current being switched begins, magnetic energy is stored in the choke coil and is equalized via the following clearing of the base-emitter section, which clearing is delayed until the fall of base current occurs. This is because the change in the current being switched induces a correspondingly directed voltage in the choke coil. The result is a brief disruptive mode operation of the switching transistor following clearing of the base-emitter section. In this way all the requirements set out hereinbefore are satisfied by a very simple circuit the only additional switching circuit element in which is the choke coil. By appropriately dimensioning the choke coil, specified current values for particular types of transistors can be readily achieved. To design the choke to suit specified current values for a particular type of transistor, the winding ratio of the two parts of the choke coil, i.e., the ratio of the inductances on the opposite sides of the tap thereon should be appropriately chosen and the inductance of the choke coil should be chosen to result in a specified delay in the fall of base current. Such design to suit a particular type of transistor presents no difficulties.

It is advantageous to provide in the connection leading to the base of the switching transistor, a resistor in parallel with a capacitor. The resistor serves to limit the base current while the capacitor enables the value of the base emitter cut-off voltage used when the transistor is in the switched-off state to be increased above what would otherwise be the case. In addition the resistor-capacitor circuit has an advantageous effect on the shape of the curve of decrease in base current with time and also on the curve of transfer with time of magnetic energy in the choke coil during the blocked phase of the transistor.

However, instead of a resistor-capacitor circuit in the base connection, a capacitor in parallel with a diode or a source of voltage can also be inserted in said connection. This gives the advantage that even with large fluctuations of base current the base current voltage remains practically constant.

If desired, a damping resistor may be provided in parallel with the choke coil. Such a damping resistor reliably guards against the possibility that an oscillation may occur during switching on or off due to the positive feedback effect and/or due to the natural resonance of the choke coil.

When the invention is used for switching the transistors in a push-pull converter, relatively long overlap times may arise. This is because, with alternate switching on of the switching transistors, one transistor is switched on while the other transistor is still in the state of delayed base current fall, i.e., while its collector-base section is just being cleared. Thus, the respective switching transistor concerned is not blocked until the time taken for its base current to decrease has elapsed, and there is therefore, an overlap time on switching on equal to this base current decrease time. Such a long overlap time is objectionable because it could lead to destruction of or damage to the switching transistors during the feeding of voltage into the push-pull transformer of the current converter, as is for example the case with current supply devices with cyclic mode in-phase controllers, because the switching current becomes very strong.

In such cases a shortening of the long overlap time is required. This may be achieved by using a circuit arrangement in which the part of the choke coil winding assigned to one switching transistor is connected with the base current circuit of the other transistor via a diode of such polarity of connection that, during switching off of the said assigned transistor, a blocking potential is applied to the base of said other transistor.

In this way the choke coil that is provided for each switching transistor is used also for generating a voltage that is fed to the other switching transistor and thus shortens the overlap time. The diode cut-off biasing circuit thus provided produces the result that the moment of switching on of one switching transistor practically coincides with the moment of switching off of the other. During clearing of said one switching transistor an opposite voltage is produced in the base current circuit of the other and prevents premature flow of base current therein during clearing time. If desired this diode cut-off bias circuit may be supplemented by a resistor-capacitor circuit the result of which is to leave a small amount of overlapping which is beneficial in protecting against excess voltage during inductive current feeding. This will be more clearly understood from detailed description which will be given later herein.

BRIEF DESCRIPTION OF THE DRAWINGS

The invention is illustrated in and further explained in connection with the accompanying drawings, in which.

DETAILED DESCRIPTION OF THE PRESENT INVENTION

Figure 1:
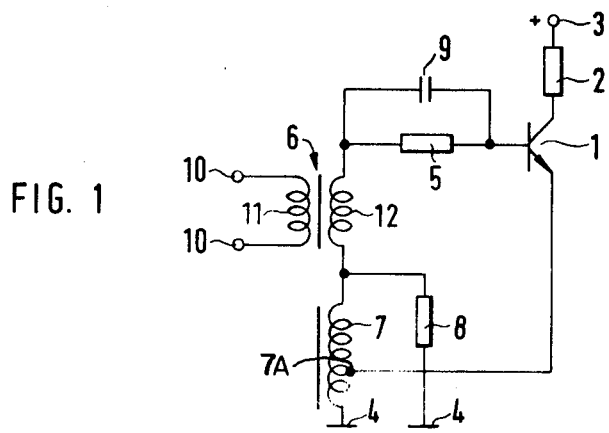
FIG. 1 is a schematic view of one embodiment of the invention.

Referring to FIG. 1, this shows a circuit arrangement containing a switching transistor 1, the collector-emitter section of which is in a current circuit including a load 2 and extending from a positive supply voltage terminal 3 and ground 4. In the base current circuit of transistor 1 is a resistor 5 in parallel with a capacitor 9, the secondary winding 12 of a control repeating coil 6 and that part of the winding of a choke coil 7 which is to be one side of a tap 7A thereon. The whole of this choke coil 7 is between one end of the secondary winding 12 and ground and the above mentioned part of said coil (the part shown above the tap 7A in FIG. 1) is between said end of the secondary winding 12 and the emitter of the transistor. The control repeating coil 6 also comprises a primary winding 11 connected between input terminals 10 to which control voltages for switching the transistor on or off are applied.

According to this invention a switching circuit arrangement for switching at least one switching transistor on and off wherein low power dissipation is achieved by delaying the change which occurs in base current to the cut-off value on conversion into the blocked state and also by providing a subsequent brief disruptive operation of the base-emitter section. In order to achieve fast switching of the transistor 1 by increasing the base current occurring at the time of switching on, the circuit arrangement includes a choke coil 7 through part of which the base-emitter current of said switching transistor is fed and through part of which the current being switched is passed or conducted in positive feedback mode.

Figure 6:
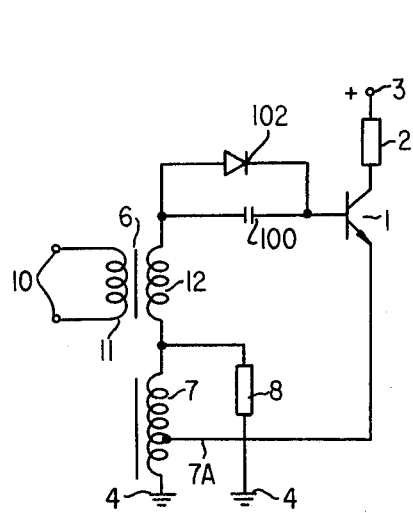
Figure 7:
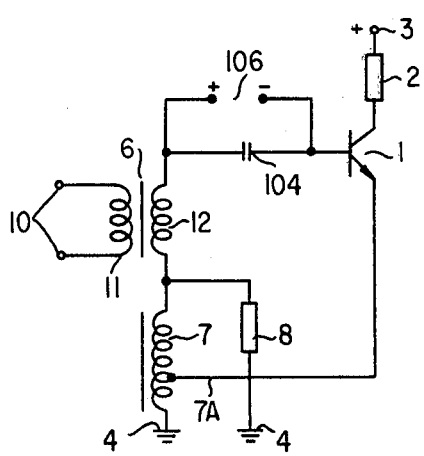

In contrast to the parallel resistor-capacitor circuit shown in FIG. 1, a parallel capacitor 100 and diode 102 circuit (FIG. 6), or a parallel capacitor 104 and source of potential 106 circuit (FIG. 7) may be inserted in the circuitry of the base of the switching transistor.

A damping resistor may be connected in parallel with the said choke coil.

The base control voltage may be a bipolar voltage which is fed into the arrangement via the control repeating coil 6 and a full-wave rectifier connected on the secondary side thereof, and the full wave rectifier may comprise, as the active elements therein, diodes or auxiliary switching transistors. In the former case the output voltage from the full wave rectifier may be applied to the base of the switching transistor via the emitter-collector section of an auxiliary transistor.

The invention may be applied to a push-pull arrangement for switching the switching transistors of a push-pull converter. Such a push-pull arrangement may comprise, in the circuitry of each switching transistor a choke coil, part of which is connected to the base current circuit of the other switching transistor via a diode of such polarity of connection that, during switching off of said switching transistor, a potential blocking the other switching transistor is applied to the base thereof. In one such push-pull embodiment of the invention, the two choke coils may be cross connected to each other via the diodes and each has one tap connected to a point of reference potential and a second tap connected to the emitter of the switching transistor the base current of which flows through part of the choke coil in question.

Further damping resistor 8 is connected between the junction point of the coils 12 and 7 and ground, i.e., it is in parallel with choke coil 7.

FIG. 1 is a positive feedback circuit because the collector current of the switching transistor 1, i.e., the current switched by the switching transistor 1, flows through part of the choke coil 7. As a result, the base current circuit is so influenced by the current being switched as to produce an increased rate of increase of current in the base current circuit.

Assume, for example, that the control signal fed in at terminals 10 is such as to produce a voltage limited feeding in of current with a cycle ratio of 1:1. When a signal switching on the switching transistor is fed in via the control repeating coil 6, a control current will flow in the base current circuit via the secondary winding 12 the resistor-capacitor circuit 5-9, the base-emitter section of the transistor 1 and the part of the choke coil 7 in the base emitter current circuit. Inductive effects, particularly the effect caused by the leakage inductance of the control repeating coil 6, will delay the increase in the base current brought about by the control signal supplied via said coil 6. However, the positive feedback effect of the choke coil 7 superimposes in the base current circuit an additional current the direction of flow of which is such as to enhance the base current directly produced by the control signal so that the rate of increase of base current is increased. The amount of this increase of rate and the degree of enhancement of base current depend on the ratio of the number of turns in the two parts of the choke coil 7 on either side of the tap 7A. Thus the speed at which the switching transistor 1 is switched on is determined by the dimensioning of the choke coil 7.

The current switched on by the transistor 1, flows through part of the choke coil 7, and magnetizes the choke. As the magnetization increases, the effect of the choke coil 7 in increasing the base current, falls away until finally, only the base current produced by the control signal itself via the control repeating coil 6 flows in the base current circuit and the switching transistor 1 is thus fully switched in.

If, after this, the control signal supplied via the coil 6 changes in a sense to cut-off the transistor 1, a reversal of polarity ensues in the secondary winding 12 and the base current decreases towards the cut-off current value. This fall is governed by the resultant of all the voltages present in the base circuit and by the inductance of the part of the choke coil 7 in said base circuit. Thus, the rate of fall of base current with time depends on the ratio between the voltage drop across the part of the choke coil 7 in the base current circuit and the inductance of this part. It will be seen therefore by appropriately dimensioning the value of this inductor 7 the waveform of the fall of base current with respect to time can be determined.

As already pointed out, the delay in the fall of the base current and the disruptive operation allow the collector-base section of the switching transistor 1 to be cleared or depleted of charge carriers at the time of cut-off. This is because, when the charge carriers have been eliminated from the base-emitter section by the cutting off of the transistor 1, the magnetic energy stored previous to this time in the choke coil 7 can be equalized in the direction of breakdown via the base-emitter section. Thus, after the time delayed base current fall towards the cut-off current values, there follows a brief disruptive operation of the base-emitter section of the switching transistor 1.

The resistor 5 is preferably dimensioned to limit the base current and, together with the capacitor 9, serves to increase the cut-off voltage in the blocked state of the transistor 1. Also the resistor-capacitor circuit 5-9 may be used to adjust the change with respect to time of the base current and of the energy equalization of the choke coil 7 during the blocked phase. The resistor 8 in parallel with the choke coil 7, is a damping resistance which prevents disturbance of correct operation by oscillatory effects.

Figure 2A:
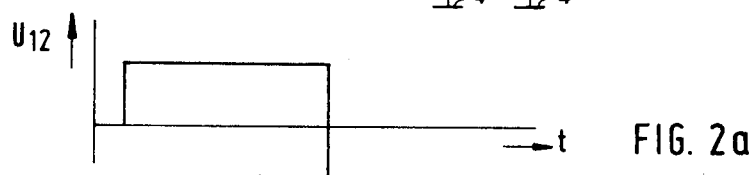
FIGS. 2a–2e show current and voltage wave forms occurring in the embodiment of FIG. 1 during a switching operation.
Figure 2B:
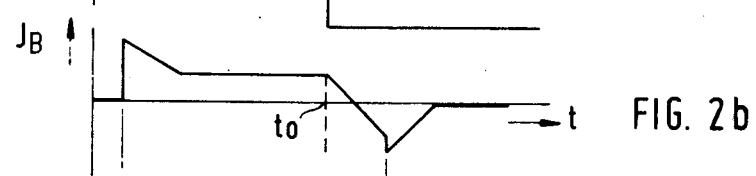
Figure 2C:
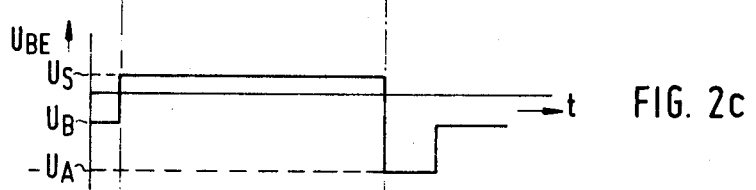

FIG. 2a shows the waveform against time (t) of control voltage $U_{12}$ across the secondary winding 12. FIG. 2b shows the waveform of the base current $J_B$. Note the fall of current commencing at time $t_o$. When the base-emitter voltage $U_{BE}$ shown in FIG. 2c is applied in the sense of switch on the transistor 1, the first thing to occur is an enhancing of the base current $J_B$ at the beginning of the switching time ts illustrated in FIG. 2e. For the duration of said switching time ts, the base-emitter voltage $U_{BE}$ has a positive value $U_S$ (see FIG. 2c) which brings about the switching on of the transistor 1. Previously to this the cut-off voltage $U_B$ was applied to the base of the transistor 1. At the time $t_o$ a polarity reversal of the control voltage $U_{12}$ occurs in the base circuit of the transistor 1, and, at this time, the delay in the fall of base current begins and is maintained until the end of the switching time ts as shown in FIG. 2b. Subsequently, there follows the brief disruptive operation of the base emitter section of the switching transistor 1, as will be seen from the fall in base-emitter voltage $U_{BE}$ to a breakdown value $U_A$ (see FIG. 2c). Following energy equalization of the choke coil 7, the base-emitter voltage $U_{BE}$ increases to a value $U_B$ corresponding to the cut-off voltage applied to the base of the transistor 1 in the blocked state.

Figure 2D:
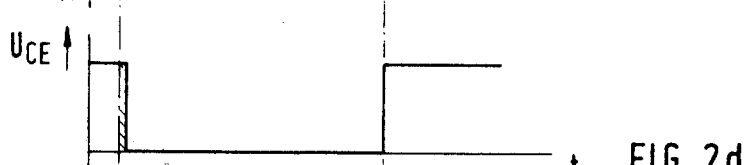
Figure 2E:
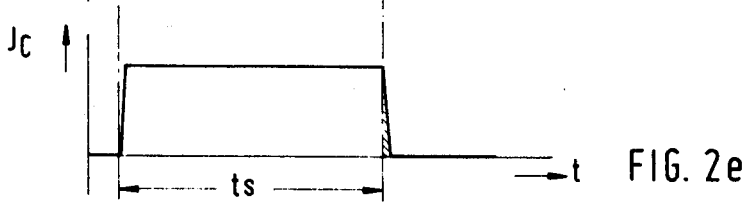

FIGS. 2d and 2e show the effects in terms of the collector emitter voltage $U_{CE}$ and of the collector current $J_C$. It will be seen that the collector-emitter voltage $U_{CE}$ displays an almost ideal waveform, there being merely a slight delay of the fall in this voltage on switching-on caused by inductance in the load current circuit. This slight delay is shown cross-hatched in FIG. 2d. At the same time the collector current $J_C$ rises very steeply as shown in FIG. 2e and, during the switching time ts it is practically constant and decays very rapidly at the end of the switching time ts. The switching-off power dissipation that does occur is in the short time between the end of the switching time ts and the actual attainment of the current-free state, i.e., when the collector-emitter current $J_C$ is zero. This short time is shown cross-hatched in FIG. 2e.

The circuit arrangement of FIG. 1 thus gives very fast switching of the transistor 1. The switching delays shown as cross-hatched in FIGS. 2d and 2e which still remain amount to only about 20% of the values likely to be present in the absence of the choke coil 7.

It should be pointed out that in the invention illustrated in FIG. 1, the control repeating coil 6 is not essential for applying the control signal. For example, the control signal could equally well be fed into the base current circuit capacitatively or galvanically. A similar comment applies to the other embodiments to be described herein.

Figure 3:
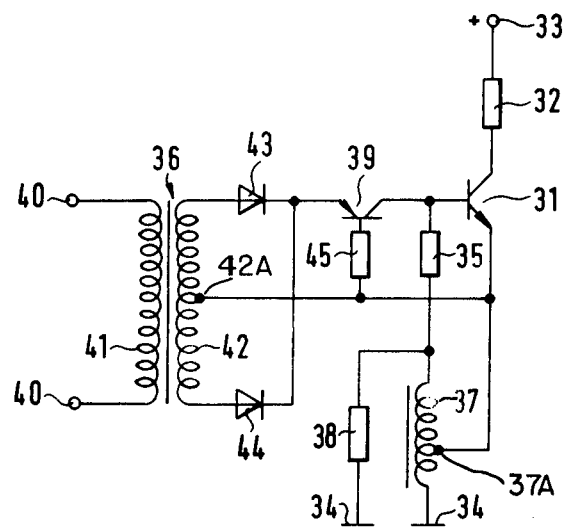
FIGS. 3, 4, 5, 6 and 7 are schematic views similar to FIG. 1, but showing modifications thereof.
Figure 4:
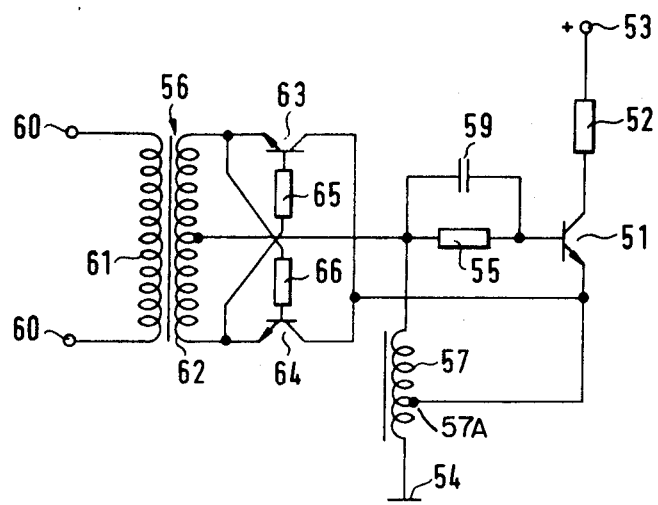

Feeding in a control signal having a high cycle ratio or large current phase angle to the base current circuit of a switching transistor for switching it on and off produces long switching on times and short blocked times. In such cases it is of advantage to effect actuation via a full-wave rectifier in order to avoid difficulties which will be experienced in designing a satisfactory control repeating coil to handle control signals with large current phase angles. FIGS. 3 and 4 illustrate embodiments in which rectifiers are used.

FIG. 3 shows a main switching transistor 31 for switching on and off an impedance load 32 of substantial reactance and which is in a current circuit between a positive supply voltage terminal 33 and ground 34. A tapped choke coil 37 and a resistor 35 are in the base emitter current circuit of the transistor 31. The choke coil 37, the tap on which is referenced 37A has a damping resistor 38 connected in parallel with it. The control signal input terminals 40 are connected to the primary winding 41 of a control repeating coil 36 the secondary winding 42 of which is center-tapped at 42A. The ends of the coil 42 are connected to a full-wave rectifier comprising diodes 43 and 44 the output terminals of which are connected to the emitter of an auxiliary switching transistor 39. The base of this transistor 39 is connected to the center tap 42A on the secondary winding 42 via a base circuit resistor 45 and also to the emitter of the main switching transistor 31 the base of which is connected to the collector of the auxiliary switching transistor 39. Thus the rectified control signal is fed into the base current circuit of the main switching transistor 31 in dependence on the voltage between the emitter and the base of the auxiliary switching transistor 39.

The auxiliary switching transistor 39 serves to decouple the negative cut-off voltage produced on its base or on the choke coil in the blocked state of the main switching transistor 31, from the secondary winding 42 of the control repeating coil 36. Such a negative cut-off voltage would be passed by the rectifier diodes 43 and 44 were there no auxiliary switching transistor 39. The base resistor 35 of the main switching transistor 31 can be used to limit the base current flowing during clearing of the base-emitter section of said transistor 31. The operation of FIG. 3 as regards the positive feedback and disruptive mode produced by the choke coil 37 is as in FIG. 1.

FIG. 4 shows a circuit arrangement which operates in manner similar to that of FIG. 3, but in which the full-wave rectifier comprises transistors 63 and 64 which also serve to render unnecessary the provision of an auxiliary switching transistor between the full-wave rectifier and the main switching transistor (here referenced 51) for the purpose of decoupling negative pinch-off voltage from the secondary winding 62 of a control repeating coil 56, because the transistors 63 and 64 themselves provide the necessary decoupling. The main switching transistor 51 switches an on and off current through a reactive impedance load 52 in a current circuit which extends between a positive supply voltage terminal 53 and ground 54. A tapped choke coil 57 with a tap 57A is arranged in positive feedback mode in the base emitter current circuit of the switching transistor 51 as in the previously described embodiments. A parallel-resistor-capacitor circuit 55–59 is inserted in the base circuit of the main switching transistor 51 and serves the same purposes as the parallel resistor-capacitor circuits in the previously described embodiments.

The full-wave rectifier circuit in FIG. 4, which includes the transistors 63 and 64 and base resistors 65 and 66 cross-connected as shown to the ends of the secondary winding 62, has the prime advantage that the two transistors 63 and 64 operate inversely during the cutting off operation of the main switching transistor 51. One factor determining the cut-off current in the base-emitter section of the main switching transistor 51 during the cutting off operation is the inverse current amplification of the two switching transistors 63 and 64. The parallel resistor-capacitor circuit 55–59 produces a bias voltage which, in the inverse operation of the transistors 63 and 64, represents their working voltage. The inverse operation of the said transistors 63 and 64 and the effect of their inverse current amplification, produces a further amplification of the clearing current of the base-emitter section of the main switching transistor 51. A bipolar control signal is fed to the control signal input terminals 60 in FIG. 4. The angular current flow period, after rectifying may be very great, as is the case with the embodiment in FIG. 3.

Figure 5:
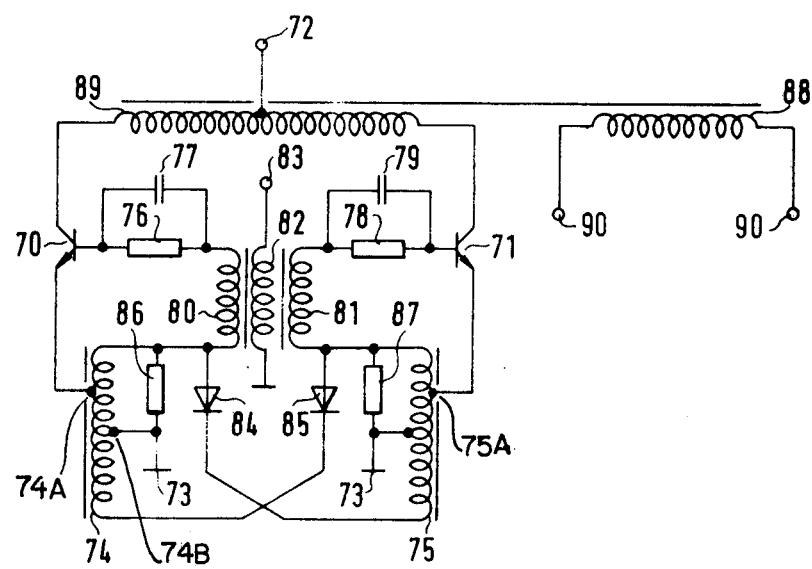

FIG. 5 shows the invention applied to a push-pull converter such as might be used, for example, for switching parts of a network. A controlled d.c. voltage is applied at terminal 72 which is continuously switched over by two switching transistors 70 and 71 in push-pull mode. This continuous switching is brought about by a control repeating coil having a primary winding 82 to which an appropriate cyclic signal is applied and two secondary windings 80 and 81 which are arranged in the respective base current circuits of the two switching transistors 70 and 71. Each base current circuit contains a tapped choke coil 74 or 75 respectively. The choke coils are arranged in positive feedback mode. The switching of the direct current fed in at terminal 72 causes a corresponding current to be induced in a secondary winding 88 at the terminals 90 of which the output current is taken off for rectification and utilization for any of a wide variety of possible purposes.

A push-pull converter operating on the principle of the embodiment in FIG. 1, and containing a respective choke coil in positive feedback connection mode in its base current circuit will exhibit long current overlap times because, during the transition from the conducting to the blocked state of a respective switching transistor, the drop in base current is delayed and during this delay period the other respective switching transistor is already switched on before the first transistor has been finally blocked. The overlap time of the switching on states of the two switching transistors corresponds with the base current decay time thereof. A long overlap time of this nature would, on feeding voltage to the primary winding (89 in FIG. 5) of the push-pull transformer, produce very high switching currents which could damage or destroy the switching transistors or, on feeding current into the said primary winding, lead to an undesirably reduced angular current flow period on the secondary winding (88 in FIG. 5).

In order to shorten the above described overlap time while still retaining fast switching on and reduced switching off power dissipation, the choke coils 74 and 75, as shown in FIG. 5, are each provided with an additional part winding at which is produced a voltage which is fed to the respective other base current circuit via a respective diode 85 or 84 respectively. By appropriate polarity selection of the voltages produced across the choke coils 74 and 75 or the diodes 85 and 84, it can be arranged that one of the transistors is switched on at a moment during the switching off phase of the other transistor. Consider the choke coil 74 and diode 85, for example. On switching on the transistor 70 the part of the choke coil 74 between ground 73 and the diode 85, i.e., the part between the diode 85 and the grounded tap 74B on said choke 74, produces in the base current circuit of the transistor 71 during the delayed base current fall in the transistor 70 or during its clearing time, an opposing voltage in the choke coil 75 because said diode 85 is connected to said choke coil 75 at the point of connection thereof to the secondary winding 81 of the control repeating coil. By suitably dimensioning the additional part of the choke coil 74, this opposing voltage can easily be so dimensioned such that no base current flow in the switching transistor 71 can occur in the transmission direction. It is only after complete clearing of the base emitter section of the switching transistor 70 that the described energy equalization effects a polarity reversal of the voltage on the choke coil 74, so that, as a result, the opposing voltage generated on the base current section of the switching transistor 71, too, is eliminated. The diode 85 effects decoupling of the two base current circuits during the disruptive phase of the switching transistor 70 in which energy equalization of the choke coil 74 takes place.

Similar action is produced by the additional part of the choke coil 75 in conjunction with the diode 84 in the base current circuit of the transistor 70.

Thus, in the embodiment of FIG. 5, shortening of the possibly damaging overlap time is achieved while still retaining the advantages of the invention as regards rapidity of switching on and reduction of power dissipation during switching off.

The resistance-capacitance circuits 76-77 and 78-79, the damping resistances 86-87 and the parts of the chokes 74, 75 immediately on opposite sides of the taps 74A, 75A serve the same purposes as the corresponding circuit parts in the previously described embodiments.

I claim:

1. A transistor switching circuit arrangement for switching at least one switching transistor on and off, said circuit arrangement having means for achieving low power dissipation by delaying the change which occurs in base current to the cut-off valve on conversion into the blocked state and by a subsequent brief disruptive operation of the base emitter section and also for achieving fast switching for the transistor by increasing the base current occurring at the time of switching on, said means comprising a choke coil connected between the base circuit of said transistor and a subsequent point through which part of the base-emitter current of said switching transistor is fed and also connected in part between the emitter of said transistor and said subsequent point, wherein the collector-emitter current being switched is passed through said part of the choke coil in positive feedback mode.

2. An arrangement as defined in claim 1 wherein a parallel resistor-capacitor circuit is connected in series with the base of the switching transistor.

3. An arrangement as defined in claim 1, wherein there is inserted in the connection to the base of the switching transistor a parallel circuit comprising a capacitor and a diode.

4. An arrangement as defined in claim 1, wherein there is inserted in the connection to the base of the switching transistor a parallel circuit comprising a capacitor and a source of potential.

5. An arrangement as defined in claim 1 wherein a damping resistor is connected in parallel with the said choke coil.

6. An arrangement as defined in claim 1 wherein a bipolar base control voltage is applied to the circuit arrangement via a control repeating coil and the secondary side of a full-wave rectifier, said rectifier having a primary side and a secondary side.

7. An arrangement as defined in claim 6 wherein the full-wave rectifier comprises diodes as the active elements therein.

8. An arrangement as defined in claim 6 wherein the full-wave rectifier comprises auxiliary switching transistors as the active elements therein.

9. An arrangement as defined in claim 6 wherein the output voltage from the full-wave rectifier is applied to the base of the switching transistor via the emitter-collector circuit of an auxiliary transistor.

10. An arrangement as defined in claim 7 wherein the output voltage from the full-wave rectifier is applied to the base of the switching transistor via the emitter-collector circuit of an auxiliary transistor.

11. A push pull circuit arrangement as defined in claim 1 for switching the switching transistors of a push pull converter wherein there is provided, in the circuitry of each switching transistor a choke coil part of which is connected to the base current circuit of the other switching transistor via a diode of such polarity of connection that, during switching off of said switching transistor a potential blocking the other switching transistor is applied to the base thereof.

12. An arrangement as defined in claim 11 wherein the two choke coils are cross-connected to each other via the diodes and each has one tap connected to a point of reference potential and a second tap connected to the emitter of the switching transistor the base current of which flows through part of the choke coil in question.

* * * * *